(12) United States Patent
Bund

(10) Patent No.: US 11,324,126 B2
(45) Date of Patent: May 3, 2022

(54) MECHANICALLY ROBUST COMPONENT CARRIER WITH RIGID AND FLEXIBLE PORTIONS

(71) Applicant: AT&S Austria Technologie & Systemtechnik Aktiengesellschaft, Leoben (AT)

(72) Inventor: Roland Bund, Fürstenfeld (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/947,517

(22) Filed: Aug. 5, 2020

(65) Prior Publication Data

US 2020/0367370 A1 Nov. 19, 2020

Related U.S. Application Data

(63) Continuation of application No. 16/059,323, filed on Aug. 9, 2018, now abandoned.

(51) Int. Cl.
| | |
|---|---|
| *H05K 1/02* | (2006.01) |
| *H05K 1/11* | (2006.01) |
| *H05K 3/46* | (2006.01) |
| *H05K 1/18* | (2006.01) |

(52) U.S. Cl.
CPC ......... *H05K 3/4691* (2013.01); *H05K 1/0278* (2013.01); *H05K 3/4652* (2013.01); *H05K 3/4694* (2013.01); *H05K 1/0281* (2013.01); *H05K 1/118* (2013.01); *H05K 1/189* (2013.01); *H05K 2201/09127* (2013.01); *H05K 2203/1469* (2013.01)

(58) Field of Classification Search
CPC .. H05K 3/4691; H05K 3/4652; H05K 3/4694; H05K 2201/09127; H05K 2203/1469; H05K 1/0271
See application file for complete search history.

(56) References Cited

U.S. PATENT DOCUMENTS

| 5,072,074 A | 12/1991 | DeMaso et al. |
| 5,633,480 A * | 5/1997 | Sato .................. H05K 3/281 |
| | | 174/254 |
| 5,655,291 A | 8/1997 | Todd et al. |
| 6,350,387 B2 | 2/2002 | Caron et al. |
| 10,321,560 B2 | 6/2019 | Yu et al. |

(Continued)

FOREIGN PATENT DOCUMENTS

| CN | 104519682 A | 4/2015 |
| CN | 105163527 A | 12/2015 |

(Continued)

OTHER PUBLICATIONS

Yang, B. et al., "Bending, Compression, and Shear Behavior of Woven Glass Fiber-Epoxy Composites," Composites Part B 31 (2000), Elsevier Science Ltd., pp. 715-721.

*Primary Examiner* — Ishwarbhai B Patel
(74) *Attorney, Agent, or Firm* — Robert A. Blaha; Smith Tempel Blaha LLC

(57) ABSTRACT

A component carrier with a rigid portion, a flexible portion, a cavity defining the flexible portion next to the rigid portion, and at least one step in a transition portion between the rigid portion and the flexible portion in the cavity is disclosed.

22 Claims, 3 Drawing Sheets

(56) References Cited

U.S. PATENT DOCUMENTS

| | | | |
|---|---|---|---|
| 2008/0047135 A1* | 2/2008 | Arnold | H05K 3/4691 |
| | | | 29/829 |
| 2008/0093118 A1 | 4/2008 | Takahashi et al. | |
| 2008/0289859 A1 | 11/2008 | Mikado et al. | |
| 2010/0025086 A1 | 2/2010 | Stahr et al. | |
| 2010/0051325 A1 | 3/2010 | Sato et al. | |
| 2012/0097326 A1 | 4/2012 | Wang et al. | |
| 2012/0181074 A1 | 7/2012 | Ishihara et al. | |
| 2013/0020120 A1 | 1/2013 | Ishihara et al. | |
| 2014/0034366 A1 | 2/2014 | Otsubo et al. | |
| 2015/0060114 A1* | 3/2015 | Park | H05K 1/115 |
| | | | 174/254 |
| 2016/0066429 A1 | 3/2016 | Taniguchi et al. | |
| 2017/0196077 A1* | 7/2017 | Iriguchi | H05K 3/4691 |

FOREIGN PATENT DOCUMENTS

| | | |
|---|---|---|
| DE | 10 2010 054 974 A1 | 6/2012 |
| EP | 1 862 505 A2 | 12/2007 |
| FR | 2 919 781 A1 | 2/2009 |
| JP | H0590756 A | 4/1993 |
| WO | WO2016003983 A1 | 1/2016 |

\* cited by examiner

MECHANICALLY ROBUST COMPONENT CARRIER WITH RIGID AND FLEXIBLE PORTIONS

CROSS-REFERENCE TO RELATED APPLICATIONS

The present application is a continuation of U.S. Ser. No. 16/059,323, filed on Aug. 9, 2018, titled, "Mechanically Robust Component Carrier With Rigid and Flexible Portions" the content of which is hereby incorporated by reference in its entirety.

TECHNICAL FIELD

Embodiments of the invention relate to a component carrier and a method of manufacturing a component carrier.

BACKGROUND

Component carriers and electronic components mounted thereon and/or embedded therein are in wide use in electronic products. By employing rigid-flexible component carriers which comprise a rigid portion and a flexible or semi-flexible portion, the advantages of both a rigid component carrier and a flexible component carrier may be combined. Increasing miniaturization and growing product functionalities as well as a rising number of electronic components to be mounted on the component carriers, such as printed circuit boards, lead to more densely packed electronic devices, wherein an increasing number of electrical contacts has to be connected.

Bending a rigid-flex board may cause high mechanical load between a rigid portion and a flexible portion of the rigid-flex board and may limit the lifetime of such component carriers.

SUMMARY

There may be a need for a component carrier with rigid portion and flexible portion which is mechanically reliable even under harsh conditions.

According to an exemplary embodiment of the invention, a component carrier is provided which comprises a rigid portion, a flexible portion, a cavity delimiting the flexible portion from the rigid portion (or defining the flexible portion next to the rigid portion, or separating the flexible portion from the rigid portion, or defining the flexible portion versus the rigid portion), and at least one step in a transition portion between the rigid portion and the flexible portion in the cavity.

According to another exemplary embodiment of the invention, a method of manufacturing a component carrier is provided, wherein the method comprises forming a stack comprising a plurality of electrically conductive layer structures and a plurality of electrically insulating layer structures, forming a cavity in the stack to thereby delimit a flexible portion and a rigid portion (or to distinguish a flexible portion from a rigid portion), and forming at least one step in a transition portion between the rigid portion and the flexible portion.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a rigid or flexible printed circuit board, an organic interposer, and an IC (integrated circuit) substrate. A component carrier may also be a hybrid board combining different ones of the above mentioned-types of component carriers.

In the context of the present application, the term "rigid portion" may particularly denote a portion of the component carrier which, when applying or exerting ordinary forces typically occurring during operation of the component carrier, the rigid portion will remain substantially undeformed. In other words, the shape of the rigid portion will not be changed when applying forces during operation of the component carrier.

In the context of the present application, the term "flexible portion" may particularly denote a portion of the component carrier which, upon exerting typical forces occurring during operation of the component carrier, will result in an elastic deformation of the flexible portion. The elastic deformation of the flexible portion may be possible to such an extent that the shape of the entire component carrier may be significantly influenced by deforming the flexible portion.

In the context of the present application, the term "cavity" may particularly denote a recess (such as a blind hole, i.e. a hole with a closed bottom, or a through-hole, i.e. a hole which extends through an entire body) defining a hollow space of the component carrier. In the context of the present application, thick portions of the component carrier defining lateral sidewalls of the cavity may form part of the rigid portion. In contrast to this, a thinner portion of the component carrier also defining a top or bottom surface extending along a horizontal plane may form part of the flexible portion.

In the context of the present application, the term "step" may particularly denote a structural or spatial discontinuity within the cavity in a spatial region in which the rigid portion and the flexible portion are adjacent to one another. Such a discontinuity may be an additional material portion modifying a corner of the cavity by forming a step shaped feature. The mentioned discontinuity may however also be a region of lacking material as compared to an ordinary corner of the cavity which may additionally form a step feature in the transition portion between flexible portion and rigid portion.

According to an exemplary embodiment of the invention, a rigid-flex component carrier may be provided having a rigid portion and a flexible portion and a step-like feature within a cavity and between the rigid portion and the flexible portion. When bending the rigid-flex component carrier at the flexible portion and/or when applying other types of mechanical load (for instance when fastening the component carrier on a support, for instance by a screw), a significant force or mechanical load may be exerted specifically in the transition portion between the rigid portion and the flexible portion in a corner region of the cavity. Conventionally, this transition portion may thus be a region of very high mechanical load being specifically prone to breakage or to negatively influence the bonding between the layers at least. When operating a rigid-flex board, tensile strain is applied to such a corner region of the cavity which may conventionally result in a risk of damage. However, the present inventors have surprisingly found that applying a compressive load (rather than a tensile load) to such a corner region may significantly reduce the risk of breakage. Without wishing to be bound to a specific theory it is presently believed that applying such a compressive force to the corner region will result in a breakage only at significantly higher forces compared to the application or exertion of tensile forces. In view of this finding, the present inventors have additionally found that when forming a spatial discontinuity in form of a step in the corner region of the cavity, i.e. at the transition between rigid portion and flexible portion, a force applied to the rigid-flex component carrier may experience an advantageous force direction conversion. More specifically, in the presence of the step, a tensile force may be redirected or converted at least partially into a compressive force before exerting the latter to the transition portion of the component carrier. As a surprising result, the rigid-flex component carrier is significantly less prone to failure when bending the flexible portion relatively to the rigid portion in the presence of a step in the cavity. Thus, a component carrier may be provided which is safely protected against damage thanks to the addition of the step feature in the transition portion of the component carrier.

In the following, further exemplary embodiments of the method and the component carrier will be explained.

A gist of an exemplary embodiment of the invention is the provision of a component carrier configured as rigid-flex board without the need of providing polyimide or the like and providing a uniform cavity without release layer and with one or more steps in the cavity which improves the mechanical integrity. In particular, such a manufacturing architecture provides for a double-sided component carrier (in particular embodied as printed circuit board, PCB) with bending area which can be manufactured with low effort and with reliable quality. This low effort may be achieved in particular by defining a bending area of the rigid-flex component carrier by milling, in particular by depth controlled milling. In particular, it may be possible to produce a double-sided rigid-flex PCB with a thin FR4 material instead of a polyimide material. Such a manufacturing process involves less effort than a standard rigid-flex PCB manufacturing process, and has highly advantageous bending characteristics. For instance, a two-layer PCB may be provided with a bending area, wherein one copper layer may be provided in the bending area and two copper layers may be foreseen in a rigid portion or area.

In an embodiment, the rigid portion has a larger thickness than the flexible portion. In other words, the higher rigidity of the rigid portion as compared to the flexible portion may be the result of a selective thinning of a layer stack in the flexible portion only.

In an embodiment, the flexible portion is enclosed at (at least) two ends (in particular edges) by the rigid portion. In such an embodiment it is also possible that the flexible portion is used as an inlay inserted into one or more rigid portions.

In an embodiment, the rigid portion and the flexible portion each comprise at least one electrically insulating layer structure. More precisely, both the rigid portion and the flexible portion may comprise a respective stack of at least one electrically insulating layer structure and/or at least one electrically conductive layer structure. The stack in the flexible portion may be composed of a lower number of layer structures as compared to the stack in the rigid portion. It is also possible that one or more of the mentioned layer structures extend(s) over both the rigid portion and the flexible portion, while at least one other of the layer structures only extends along the rigid portion. Hence, the rigid portion and the flexible portion may share a common electrically insulating layer structure. This renders the component carrier mechanically stable, even when bending the flexible portion.

In an embodiment, the electrically insulating layer structures of the rigid portion and of the flexible portion are made of material having the same value of the Young modulus, in particular are made of the same material. For instance, the electrically conductive layer structures both in the rigid portion and in the flexible portion may be made of copper, whereas the electrically insulating layer structures in both the rigid portion and the flexible portion may comprise resin, if desired in combination with reinforcing structures such as glass fibres or glass spheres. An optional solder mask in the flexible region may however be different than in the rigid region. By using the same materials for both the rigid portion and the flexible portion, a manufacture of the component carrier with low effort and homogeneous material composition is accomplished. The latter also has advantages in terms of thermal load which can be kept small with a configuration of the component carrier having similar or identical materials in the rigid portion and the flexible portion. The rigidity and the flexibility in the rigid portion and the flexible portion, respectively, may then be the mere result of a different thickness in the mentioned portions. However, alternatively, it is also possible to use more flexible materials (such as polyimide) in the flexible portion than in the rigid portion (for instance prepreg).

In an embodiment, the electrically insulating layer structures of the rigid portion and of the flexible portion comprise resin with reinforcing particles, in particular reinforcing glass fibers or glass spheres. The presence of reinforcing structures such as glass fibres are considered as an important source for failure upon applying an excessive tensile force to the transition region. It is believed that the glass fibres may break here even in the presence of a relatively small tensile force (in the absence of a step). However, the presence of the mentioned one or more steps in the transition region may redirect the forces exerted to the component carrier in particular in the transition portion. As a result, the tendency of breakage in the transition region may be strongly suppressed. In particular, the reinforcing particles may be prevented from breakage in such a scenario.

In an embodiment, the cavity has a rectangular cross-section with corners, wherein the step is formed in at least one of the corners, i.e. as an additional feature in the corner. In other words, the step may be a feature being provided in addition to the corner of the cavity. By the provision of such a step feature, the tendency of a component carrier of breaking when a force is exerted to this corner region may be strongly suppressed. In an embodiment, the step may be precisely formed in the corner so that the step and the corner may overlap.

In an embodiment, the flexible portion is one of the group consisting of a fully flexible portion, and a semi-flexible portion. Thus, the flexible portion may be configured so that only a slight bending (semi-flexible property) or a strong or dynamic bending (fully flexible property) is enabled.

In an embodiment, the fully flexible portion comprises or consists of at least one of the group consisting of polyimide, polyamide, and liquid crystal polymer (LCP). Other fully flexible materials may be used as well.

In an embodiment, the semi-flexible portion comprises or consists of at least one of the group consisting of FR4, and Resin Coated Copper (RCC). FR4 may be a combination of resin (in particular epoxy resin) and reinforcing particles (in particular glass fibres). An RCC can be denoted as a semi-finished product comprising a copper foil covered with a resin.

In an embodiment, a width of the at least one step is at least 20 µm, in particular at least 50 µm, in a horizontal direction of the plate shaped component carrier. In an embodiment, a height of the at least one step is at least 20 µm, in particular at least 50 µm, in a vertical direction of the plate shaped component carrier. It has turned out that step dimensions of the mentioned sizes are appropriate for significantly preventing the tendency of the component carrier to break in the transition region in the event of mechanical load. The steps may however be also larger, for instance at least 100 µm.

In an embodiment, the at least one step is formed at least partially by a cured low-flow prepreg layer or a cured no-flow prepreg layer in the transition portion. In the context of the present application, the term "low-flow material" (sometimes also denoted as "no-flow material") may particularly denote material which has no or only a very limited tendency to flow during processing under external pressure and elevated temperature, in particular during lamination. In particular, low-flow material may have a sufficiently high viscosity, for instance at least 5,000 Poise, preferably at least 10,000 Poise, at lamination temperature (for instance 150° C.). For example, when ordinary prepreg is heated under pressure, its resin melts (liquefies) and freely flows in any voids in the environment. There is a certain period of time during which the resin of ordinary prepreg remains fluidic enough to flow freely. In contrast to this, low-flow material as implemented in accordance with exemplary embodiments of the invention is specifically configured to suppress or even eliminate flow during lamination, so that the low-flow material substantially rests in place during lamination. However, the "low-flow material" or "no-flow material" may still be at least partially uncured when being provided prior to lamination. Such a no-flow prepreg or low-flow prepreg has the tendency of substantially not flowing into the region of the step when connecting the no-flow prepreg or low-flow prepreg with other layer structures during lamination. In the presence of thermal energy and/or pressure, an ordinary prepreg may re-melt and the corresponding resin may flow into tiny gaps during lamination. After a corresponding cross-linking procedure of the resin is completed, the resin is re-solidified and then remains spatially fixed. If ordinary prepreg is used for the component carrier according to an exemplary embodiment of the invention, care should be taken to prevent excessive flow of resin into a region (such as the below described indentation) which should be kept free of resin for forming the step. However, when using low-flow prepreg or no-flow prepreg, such potential issues are overcome by preventing the flow of resin into a gap which shall remain free of material for properly defining the step. Thus, the use of no-flow prepreg or low-flow prepreg is highly preferred.

In an embodiment, the at least one step forms a convex protrusion (such as a circumferentially closed protrusion) extending from at least one corner of the cavity into the cavity. Such a rectangular protrusion may highly efficiently redirect forces exerted to the transition region from a tensile force into a compressive force, thereby efficiently suppressing the risk of breakage in the corner region of the rigid-flex component carrier.

In an embodiment, the at least one step forms an undercut (such as a circumferentially closed undercut) in at least one corner of the cavity. When such an undercut is formed in the transition region, the undercut is accompanied by a portion of a layer structure extending further into the cavity and being located below the undercut. It has turned out that even such a step feature has the capability of resulting in the above described force redirection with the effect that there is a lower tendency of breakage in the corner region.

In an embodiment, the flexible portion is arranged between different sections of the rigid portion. For instance, the flexible region may be a central region of the component carrier, whereas two rigid portions are formed as being connected to respective opposing ends of the flexible region.

In an embodiment, the at least one step is configured as one of the group consisting of a single step and a double step. For instance, the corner of the cavity may be equipped with exactly one step (in addition to the corner itself), which may correspond to a protrusion or an undercut. Alternatively, the corner of the cavity may be provided with two steps, which may correspond to two stepped protrusions or two stepped undercuts. In particular a double step or double undercut may provide a strong robustness against failure in the transition portion.

In an embodiment, the method comprises forming the cavity by removing material of the stack. This may be accomplished by milling, in particular by deep milling. In particular by the combination of a milling procedure with a formation of the stack using two constituents being both already fully cured at the time of lamination, removal of a separated piece of the layer structures can be accomplished without the use of a release layer.

With the concept of a release layer, which can be implemented in another exemplary embodiment of the invention as well, a non-adhesive material is embedded within a layer stack. The formation of a cavity may then be accomplished by cutting out a portion of the layer stack (for instance by milling along a circumferential line) and simply taking out the separated piece. This simple separation is possible as a result of the non-adhesive property of the release layer (for instance a layer made of a waxy material).

In an embodiment, the method comprises defining the at least one step by correspondingly positioning a milling tool for removing material of the stack for forming the cavity. Descriptively speaking, by adjusting the lateral position of the milling tool, it is simply possible to define the position, dimension and type (i.e. protrusion or undercut, single step or multiple step, etc.) of the mentioned step. Reference is made to FIG. 7 to FIG. 11.

In an embodiment, the method comprises forming the stack by arranging an uncured layer structure (in particular a low-flow or no-flow uncured layer structure) between a first fully cured layer structure and a second fully cured layer structure, and subsequently curing the uncured layer structure. In the context of the present application, the term "at least partially uncured material" particularly denotes material which has the property to at least partially melt or become flowable by the application of elevated pressure and/or elevated temperature, and become fully hardened or cured (and thereby becomes solid) when releasing the applied elevated pressure and/or elevated temperature. Consequently, applying elevated pressure and/or elevated temperature may cause liquidation of the curable or at least partially uncured material, followed by a hardening (for instance an irreversible hardening in the case of thermosetting materials, wherein other materials may be used as well) upon releasing the applied high pressure and/or high temperature. In particular, the "at least partially uncured material" may comprise or consist of B-stage material and/or A-stage material. By providing the layer structure from resin, prepreg or any other B-stage material, the layer structure may re-melt during lamination so that resin (or the like) may flow for interconnecting the various elements and for closing gaps or voids and may therefore contribute to a stable intrinsic interconnection within the component carrier under manufacture. Upon connecting such a structure by the application of pressure and/or heat, i.e. by lamination, only the low-flow prepreg or no-flow prepreg will re-melt slightly and accomplish a local connection. The two fully cured layer structures will not establish a mutual adhesive connection, allowing to subsequently take out a piece delimited by a circumferential milling or cutting line and the direct connection area between the two fully cured layer structures.

Additionally or alternatively to the provision of an uncured layer structure, it is also possible to use other connection techniques such as the provision of an adhesive layer (for instance an anisotropic adhesive), a bonding sheet, etc.

In an embodiment, the first fully cured layer structure has a stepped profile with a central protrusion (for instance made of copper) surrounded by a lateral base (for instance made of a dielectric, which may comprise resin) and an indentation (such as a circumferential or annular channel or groove) between the protrusion and the base. Descriptively speaking, the central protrusion may define an area where no adhesion between the two fully cured layer structures is enabled, whereas the base may define an indirect connection area between the fully cured layer structures via an uncured layer structure described below.

In an embodiment, the (preferably, but not necessarily low-flow or no-flow) uncured layer structure is a patterned layer with a central recess extending to laterally encompass the protrusion and the indentation and to accommodate the protrusion. In other words, the recess and the protrusion may match or may be adjusted to one another. Thus, a form closure between the constituents to be connected with one another may be established, thereby ensuring a proper mutual positioning of these constituents. The connection between the two fully cured layer structures may be established exclusively in a region where the uncured layer structure is present. In a region of a direct connection between the fully cured layer structures however, intentionally no connection is established, which allows formation of the cavity by milling or the like.

In an embodiment, the method comprises forming the cavity by removing material substantially laterally inside of the indentation. Thanks to the intentionally poor adhesion between the two fully cured layer structures at their direct connection surfaces, a corresponding material piece can be simply taken out and thereby separated from the rest of the layer stack.

In an embodiment, the method comprises removing material substantially laterally inside of the indentation by cutting substantially around the indentation and taking out a piece of material. This piece of material may be defined laterally by a corresponding cutting line (for instance formed by milling) and horizontally by a non-adhering interface between the first fully cured layer structure and the second fully cured layer structure. Preferably, such a circumferential cut may be carried out by a milling tool while simultaneously defining the at least one step.

It is possible that one or more components is or are surface mounted on and/or embedded in the component carrier. The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. However, the component may also be a further component carrier, for example in a board-in-board configuration. One or more components may be surface mounted on the component carrier and/or may be embedded in an interior thereof. Moreover, also other than the mentioned components may be used as a component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired accompanied or supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes or any other kinds of interconnection (in particular with an angle between 0° and 90°, preferably perpendicular to the surface)

through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, dielectric material of the least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, electrically conductive material of the at least one electrically conductive layer structure comprises at least one of the group consisting of copper, aluminum, nickel, silver, gold, palladium, or tungsten. Although copper is usually preferred, other materials or coated versions thereof are possible as well, in particular coated with supraconductive material such as graphene.

In an embodiment, the component carrier is a laminate-type body. In such an embodiment, the semifinished product or the component carrier is a compound of multiple layer structures which are stacked and connected together by applying a pressing force, if desired accompanied by heat.

BRIEF DESCRIPTION OF THE DRAWINGS

Embodiments of the component carrier can be better understood with reference to the following drawings. The elements and features in the drawings are not necessarily to scale, emphasis instead being placed upon clearly illustrating the structures and principles of operation of the assemblies.

DETAILED DESCRIPTION OF ILLUSTRATED EMBODIMENTS

Figure 1:
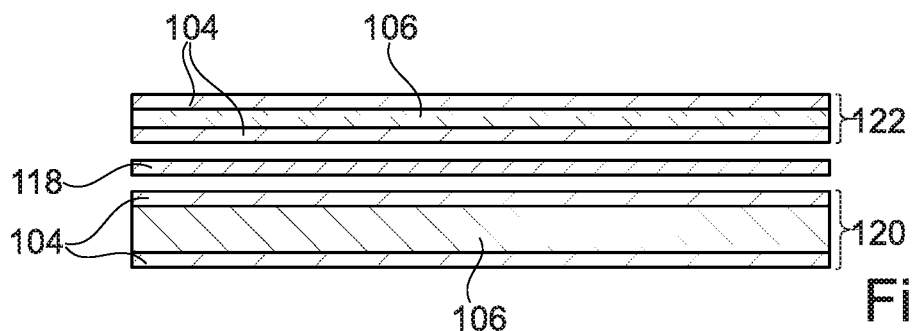
FIG. 1, FIG. 2, FIG. 3, and FIG. 4 illustrate cross-sectional views of structures obtained during manufacturing a component carrier, shown in FIG. 5, according to an exemplary embodiment of the invention.

The illustrations in the drawings are schematically presented. In different drawings, similar or identical elements are provided with the same reference signs.

The aspects defined above and further aspects of the invention are apparent from the examples of embodiment to be described hereinafter and are explained with reference to these examples of embodiment.

Before, referring to the drawings, exemplary embodiments will be described in further detail, some basic considerations will be summarized based on which exemplary embodiments of the invention have been developed.

According to an exemplary embodiment of the invention, a component carrier configured as rigid-flex board may be manufactured with a cavity, which separates a rigid portion from a flexible portion and which comprises one or more steps. Descriptively speaking, the presence of the at least one or more steps functions as mechanical discontinuity and intentionally disturbs propagation of external mechanical load within the component carrier. Such forces may conventionally result in a tendency of breakage of the rigid-flex component carrier. Redirection or manipulation of such forces (in particular of tensile stress) by the one or more steps may improve the mechanical robustness of the component carrier and the mechanical integrity. Such manipulation may involve a change of a force propagation direction and/or an at least partial conversion of highly destructive tensile stress into less destructive compressive stress. The latter may be achieved by forming at least one step in a cavity of the rigid-flex component carrier, because the formation of such a step in a cavity has turned out to result in less stress, less wear and a higher lifetime of the component carrier.

In an embodiment, it is also possible to manufacture the rigid-flex component carrier without polyimide foil. An exemplary embodiment provides a double sided plated through hole PCB with a milling area for bending. In this respect, one challenge is that the thickness of the FR4 material in the milling area is frequently not stable and, in particular during the bending process, the conductors may crack in this area. In order to overcome this issue, an exemplary embodiment of the invention provides a simple method of manufacturing a rigid flex PCB using FR4 (i.e. resin with reinforcing glass structures) instead of a polyimide foil for the purpose of establishing a flex region. Advantageously, a stable material thickness may be defined by thin FR4 material in the bending area. In comparison with this and in conventional approaches, it has not been possible to provide a stable material thickness in the bending area. Further advantageously, exemplary embodiments of the invention enable the production of a rigid-flex component carrier with a cavity (defining a flex region) which can be manufactured precisely and in a simple way. This reduces the complexity of the manufacturing process. Hence, the manufacturing process involves reasonable effort, and in particular less effort than a standard rigid-flex PCB process, while simultaneously providing better bending characteristics than obtainable with conventional methods.

Figure 3:
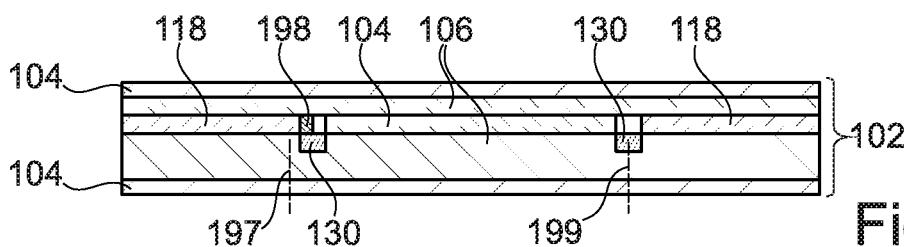
Figure 4:
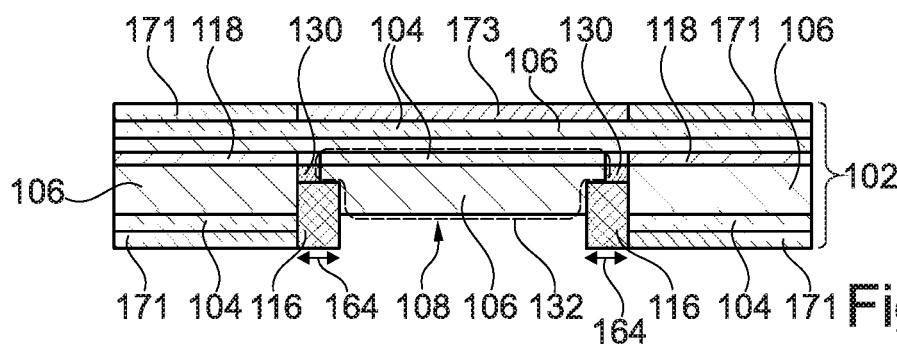
Figure 5:
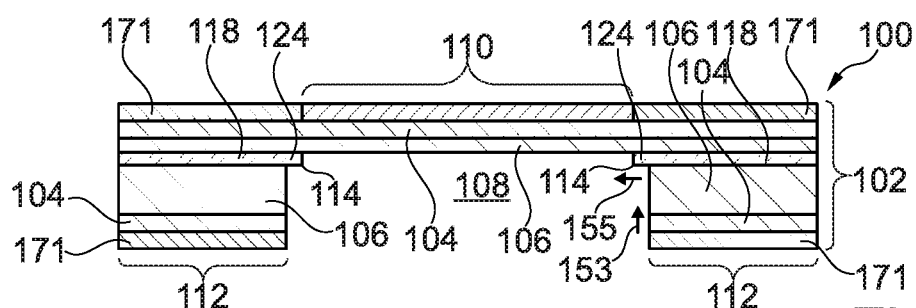

FIG. 1 to FIG. 5 illustrate cross-sectional views of structures obtained during manufacturing a component carrier 100, shown in FIG. 5, according to an exemplary embodiment of the invention.

Referring to FIG. 1, base materials for the manufacturing process are shown. In particular, a low-flow or no-flow uncured layer structure 118 is sandwiched between a first fully cured structure 120 and a second fully cured structure 122. The fully cured structures 120, 122 have already been fully cured by cross-linking their resin material as a result of the application of pressure and/or heat. Consequently, a further application of pressure and/or heated will not re-melt again the already fully cured structures 120, 122. Thus, the fully cured structures 120, 122 are incapable or no longer capable of generating an adhering force for connecting adjacent layer structures. In contrast to this, uncured layer structure 118 has not yet been fully cured by cross-linking its resin material by the application of pressure and/or heat. Thus, applying pressure and/or heat may re-melt the not yet cured resin material of the uncured layer structure 118 which is therefore capable of providing an adhesion function with connected layer structures upon triggering the curing process. For instance, the uncured layer structure 118 may be made of a low-flow or no-flow prepreg (i.e. resin, such as epoxy resin, comprising reinforcing particles, such as glass fibers). Such a low-flow or no-flow prepreg has the property that it will only flow to a very limited extent, if at all, into adjacent gaps during curing (which may be triggered by pressure and/or heating). Also liquid dielectrics may be used.

The first fully cured layer structure 120 may be a core, whereas the second fully cured layer structure 122 may be a thinner core (i.e. thinner than the core constituting the first fully cured layer structure 120). Both of the fully cured layer structures 120, 122 may be composed of a central FR4 layer as electrically insulating layer structure 106 covered on both opposing main surfaces thereof by a respective copper foil as electrically conductive layer structure 104. A thickness of the electrically insulating layer structure 106 of the first fully cured layer structure 120 may be larger than a thickness of the electrically insulating layer structure 106 of the second fully cured layer structure 122. The first fully cured layer structure 120 may also be configured as a multi-layer array.

Figure 2:
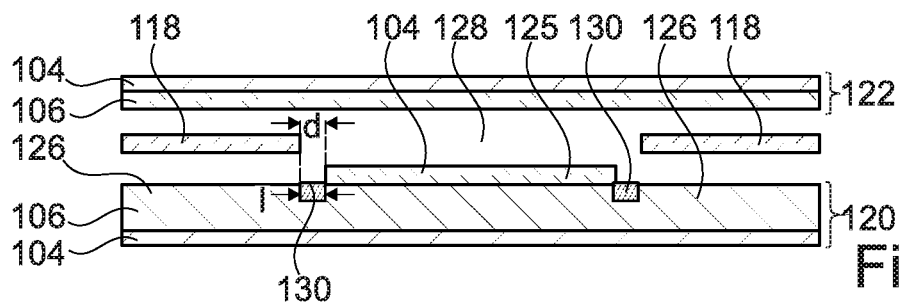

Referring to FIG. 2, preparation of the base materials shown in FIG. 1 before lay-up is illustrated.

As shown, the first fully cured layer structure 120 is provided with a stepped profile with a central protrusion 125 surrounded by a lateral base 126 and an indentation 130 in the base 126. This can be accomplished by patterning the upper electrically conductive layer structure 104 of the first fully cured layer structure 120. The indentation 130 may be formed as a groove or channel in the electrically insulating layer structure 106 of the first fully cured layer structure 120 along a pre-determined Rigid-flex transition line. The indentation 130 may be formed to laterally surround the protrusion 125 and will later serve for defining formation of a cavity 108. For forming the indentation 130, it is possible to remove the FR4 material of the electrically insulating layer structure 106 of the first fully cured layer structure 120 at one side except the region defined by the inlay copper of protrusion 125 in the later bending area of the rigid-flex component carrier 100 to be manufactured. Dielectric material may be mechanically, physically or chemically removed, copper may be etched. It is also possible to form the indentation 130 by carrying out a pre-deep milling procedure in the thick FR4 material of the electrically insulating layer structure 106 of the first fully cured layer structure 120.

Furthermore, the low-flow or no-flow uncured layer structure 118 is patterned to form a central recess 128 matching to the protrusion 125. The central recess 128 is positioned and dimensioned to accommodate the protrusion 125 and to be aligned with the indentation 130. Formation of the central recess 128 in the low-flow or no-flow uncured layer structure 118 may be accomplished, for example, by milling, punching or laser cutting the low-flow or no-flow uncured layer structure 118 selectively. Thus, the upper copper foil of the first fully cured layer structure 120 is patterned for forming the protrusion 125 providing a form closure with the recessed at least partially uncured low-flow or no-flow layer structure 118. The thickness of the upper electrically conductive layer structure 104 of the first fully cured layer structure 120 forming the protrusion 125 on the one hand and the thickness of the at least partially uncured low-flow or no-flow prepreg layer structure 118 may be the same or may be similar so as to obtain a vertical alignment.

Beyond this, the second fully cured layer structure 122 may be processed for removing the lower electrically conductive layer structure 104, for instance by carrying out a one-sided etching procedure. In other words, the lower copper foil may be removed from the second fully cured layer structure 122. When implementing a release layer (i.e. a layer made of material having poor adhesion properties with regard to surrounding material), a sequential build up is possible as well.

The indentations 130 or slits serve for spatially delimiting the cavity 108 to be formed. Descriptively speaking, the indentations 130 support a milling tool 116 (see FIG. 4) to properly spatially define a flex region 110 of the component carrier 100 to be formed. As can be taken from FIG. 2, a gap "d" is defined between an interior side wall of the uncured low-flow or no-flow prepreg layer structure 118 and an adjacent side wall of the upper electrically conductive layer structure 104 of the first fully cured layer structure 120. Preferably, the dimension of gap "d" may be selected to be identical or substantially identical to a horizontal extension "l" of the indentation 130. More precisely, it should be mentioned that gap "d" denotes the corresponding dimension after connection of the shown layers (which means that, during cutting, the flow of material during lamination should be taken into account). More specifically, the exterior side wall of the indentation 130 may be in alignment with the interior side wall of the uncured low-flow or no-flow prepreg layer structure 118. Furthermore, the interior side wall of the indentation 130 may be in alignment with the sidewall of the upper electrically conductive layer structure 104 of the first fully cured layer structure 120. This geometry advantageously contributes to a proper formation of protrusion 124 and step 114 shown in FIG. 5.

Referring to FIG. 3, an interconnected stack 102 is formed by connecting the low-flow or no-flow uncured layer structure 118 between the first fully cured layer structure 120 and the second fully cured layer structure 122 by lamination, i.e. the application of pressure and/or heat. As a result, only the electrically insulating uncured material of the low-flow or no-flow uncured layer structure 118 may re-melt, carry out cross-linking and may subsequently re-solidify. As a result, an adhesion force is created exclusively at the direct interfaces between layer structure 118 and the directly connected layer structures 120, 122. Since layer structure 118 is made of low-flow or no-flow material, this material will not flow or will not flow significantly into indentation 130, thereby advantageously keeping indentation 130 open and thereby simplifying the formation of the cavity 108 in a later process. For ensuring that material of layer structure 118 does not completely fill indentation 130 during lamination, the recess 128 formed in layer structure 118 according to FIG. 2 may be made sufficiently large. In contrast to this, no adhesion force is provided by the fully cured layer structures 120, 122 where they directly contact each another, since they are incapable of re-melting during lamination. As a result, no adhesive connection will be formed between the fully cured layer structures 120, 122 in a region corresponding to the upper main surface of the protrusion 125.

As can be taken from the cross-sectional view of FIG. 3, the recessed uncured electrically insulating layer structure 118 is configured so that prepreg material is safely prevented from flowing into the indentations 130 during lamination. The distance or gap "d" may be maintained unfilled with the previously uncured (low-flow or) no-flow prepreg layer structure 118 being cured during lamination, since in particular no-flow prepreg has the property of performing substantially no-flow during curing. However, the distance or gap "d" may be alternatively partially or entirely filled with the previously uncured low-flow (or no-flow) prepreg layer structure 118 being cured during lamination, since in particular low-flow prepreg has the property of performing a certain (however relatively small) flow during curing.

Referring to FIG. 4, material is removed to thereby form a cavity 108 in the stack 102 to delimit a flexible portion 110 defined by the cavity 108 from a rigid portion 112. The flexible portion 110 corresponds to the portion of the cavity 108, whereas the rigid portion 112 corresponds to thicker portions of the stack 102 around the cavity 108. Forming the cavity 108 may be accomplished by removing material of the stack 102 by milling using a milling tool 116 (indicated schematically in FIG. 4). During the milling, the lateral position of the milling tool 116 may be controlled so that steps (see reference numeral 114 in FIG. 5) are defined. The corresponding spatial adjustability of the position of the milling tool 116 is indicated by double arrows 164. Forming the cavity 108 may hence be accomplished by removing material substantially laterally inside of the indentation 130 by cutting the stack 102, from a bottom side thereof, substantially around the indentation 130. Thereafter, a non-adhering piece 132 of material surrounded by a corresponding cutting line may be simply taken out of the stack 102, thereby obtaining the cavity 108. The piece 132 does not adhere circumferentially, since it is circumferentially separated from the rest of the layer structure shown in FIG. 3 by milling. Furthermore, the piece 132 does not adhere at its top surface which corresponds to the upper main surface of the protrusion 125, since it does not comprise material of the (meanwhile cured) layer structure 118. Since the upper surface of the separation area delimiting the piece 132 is formed by the interface between the upper electrically conductive layer structure 104 of the former first fully cured layer structure 120 and the electrically insulating layer structure 106 of the former second fully cured layer structure 122, the lamination has not caused an adhesion there.

As further shown in FIG. 4, a finishing procedure may be carried out by forming a first solder mask 171 on a portion of exposed electrically conductive surfaces of the obtained layer structure in the rigid portion 112, while a second solder mask 173 may be formed on an upper portion of exposed electrically conductive surfaces of the obtained layer structure in the bending portion or flexible portion 110.

After having taken out the piece 132 and after formation of the solder masks 171, 173, the component carrier 100 shown in FIG. 5 is obtained.

Referring to FIG. 5, the PCB manufacturing process may be finished by defining circumferential step 114 by correspondingly positioning the milling tool 116 for removing material of the stack 102 for forming the cavity 108 and by taking out the correspondingly formed piece 132. The step 114 is formed in a transition portion between the rigid portion 112 and the flexible portion 110 (which may, more precisely, have the properties of a semi-flexible portion) in a corner of the cavity 108. A slight flow of low-flow prepreg or no flow prepreg may occur.

As a result, the component carrier 100 shown in FIG. 5 is obtained which comprises the exterior rigid portion 112, the central flexible portion 110 and the cavity 108 delimiting the flexible portion 110 from the rigid portion 112. In other words, the flexible portion 110 is arranged between or is enclosed by different sections of the rigid portion 112. The step 114 in a transition portion between the rigid portion 112 and the flexible portion 110 in corners of the cavity 108 improves the mechanical integrity, as described below in further detail. While the rigid portion 112 and the flexible portion 110 comprise substantially the same materials (predominantly copper, resin and glass fibers), the rigid portion 112 is rendered rigid by providing it with a larger vertical thickness than the flexible portion 110. The latter is rendered flexible in view of its small thickness. As can be taken from FIG. 5 as well, the rigid portion 112 and the flexible portion 110 share a common continuous electrically insulating layer structure 106 which corresponds to the original electrically insulating layer structure 106 of the second fully cured layer structure 122.

As shown in FIG. 5, the cavity 108 has a rectangular cross-section with corners in which the step 114 is formed as a convex protrusion 124. More precisely, the step 114 is formed by the meanwhile cured low-flow prepreg layer structure 118 in the transition portion.

Still referring to FIG. 5, the intentional spatial displacement of the milling tool 116 defines properties of the steps 114 which are embodied as protrusions 124 in the corners of the formed cavity 108 in the embodiment of FIG. 5. The presence of the steps 114 has a highly positive impact on the mechanical integrity of the component carrier 100 even in the presence of bending forces or other tension forces exerted to the component carrier 100 during operation or handling. As can be taken from reference numerals 153, 155, an exerted force (see reference numeral 153) may be manipulated or redirected by the step 114 (see reference numeral 155). For instance, tensile forces may be at least partially transferred into compressive forces. The capability of the component carrier 100 to deal with compressive forces is much more pronounced than the capability of the component carrier 100 to deal with tensile forces. For instance, such forces may be exerted to the component carrier 100 during screwing the component carrier 100 to another electronic member, etc. Whichever theoretical explanation may be given, it has turned out that the presence of the step 114 improves the mechanical integrity of the component carrier 100.

In the corner region or transition region of the component carrier 100, the exerted force may be a maximum. However, the breakage force in the corner region may be very small in the absence of the step 114. In particular already quite small tensile forces may cause a breakage (in particular of glass fibres) of the component carrier 100. By the presence of the step 114, the force limit of failure is significantly increased. The mechanical integrity of the component carrier 100 can therefore be significantly improved. Without wishing to be bound to a specific theory it is presently believed that when forming a spatial discontinuity in form of step 114 in the corner region of the cavity 108, a force (see arrow 153 in FIG. 5) applied to the rigid-flex component carrier 100 may experience an advantageous redirection of the force direction at or by the step 114 (see arrow 155 in FIG. 5), in particular at least partially from a vertical force direction to a horizontal force direction.

Again referring to FIG. 3, three scenarios will be discussed in the following according to which the step 114 is formed by a protrusion 124 or an undercut 134.

As indicated with reference numeral 197 in FIG. 3, a first scenario may correspond to a position of the milling tool 116 in which the milling tool 116 is positioned laterally outwardly from the indentation 130. In this embodiment, a configuration as shown in FIG. 5 can be obtained in which the step 114 is formed by protrusion 124, since a relatively large amount of material of the stack 102 is removed.

As indicated with reference numeral 198 in FIG. 3, a second scenario may correspond to a situation in which gap "d" is (here partially) filled with material of the prepreg layer structure 118 during lamination. Also in the second scenario a step 114 is obtained which is defined by a protrusion 124.

As indicated with reference numeral 199 in FIG. 3, a third scenario may correspond to a position of the milling tool 116 in which the milling tool 116 is positioned laterally inwardly from an exterior side wall of the indentation 130. In this embodiment, a configuration as shown in FIG. 7 (described below in further detail) can be obtained in which the step 114 is formed by an undercut 134, since a relatively small amount of material of the stack 102 is removed.

Figure 6:
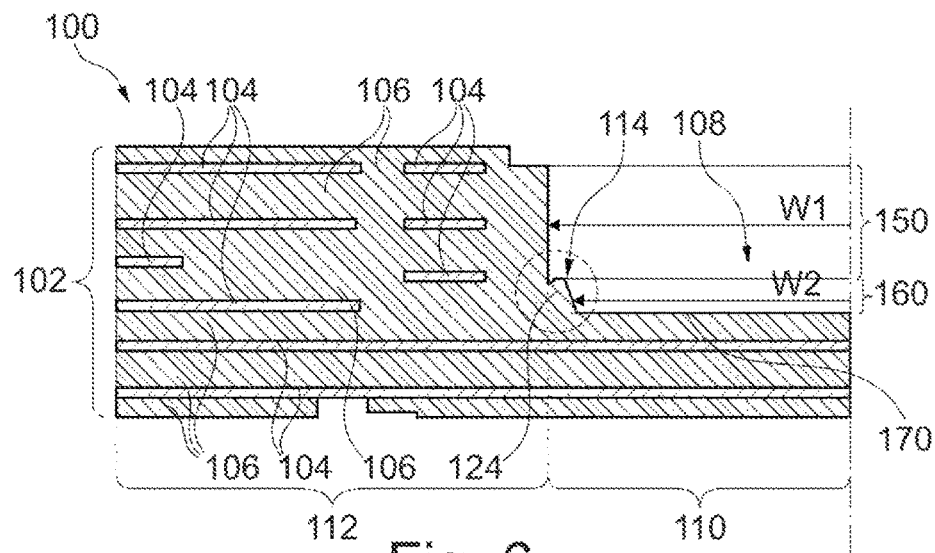
FIG. 6 is a cross-sectional view of a portion of a component carrier according to an exemplary embodiment of the invention.

FIG. 6 is a cross-sectional view of a portion of a component carrier 100 according to an exemplary embodiment of the invention. FIG. 6 shows another cross-sectional view of a component carrier 100 according to an exemplary embodiment of the invention in which the shape of the step 114 deviates from a rectangle. The shape of the step 114 is more complex according to FIG. 6. FIG. 6 illustrates a multilayer structure in the center with several flex layers thereon. The component carrier 100 includes a first cavity portion 150 above the step 114 and a second cavity portion 160 below the first cavity portion 150. The first cavity portion 150 has a first width W1 above the step 114. The second cavity portion 160 has a second width W2 shorter than the first width W1. A bottom surface 170 of the cavity 108 is defined by a surface of an the electrically insulating layer structure 106 that is common to both the rigid portion 112 and the flexible portion 110.

Figure 7:
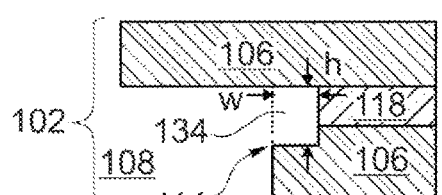
FIG. 7, FIG. 8, FIG. 9, FIG. 10 and FIG. 11 illustrate cross-sectional views of stepped cavity portions of component carriers according to exemplary embodiments of the invention.

FIG. 7 illustrates a cross-sectional view of a stepped cavity portion of a component carrier 100 according to another exemplary embodiment of the invention. According to FIG. 7, the step 114 forms an undercut 134 in a corner of the cavity 108. For example, the width "w" of the undercut 134 defining the step 114 may be 20 µm in a horizontal direction. The height "h" of the undercut 134 defining the step 114 may be for example 20 µm in a vertical direction.

An undercut 134 is formed by the presence of the step 114 according to the embodiment of FIG. 7. Similarly, the direction of an external force can be redirected by the step 114 for strengthening the robustness of the component carrier 100 against failure in the presence of external load.

Figure 8:
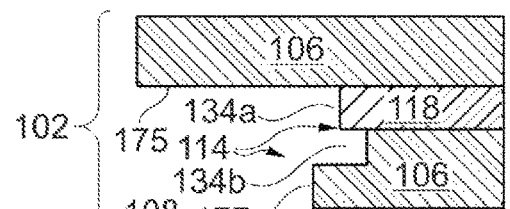

A difference between the cavity portion shown in FIG. 8 and the cavity portion shown in FIG. 7 is that, according to FIG. 8, a double undercut 134a, 134b is formed corresponds to a double step 114, 114. Undercut 134a is located directly adjacent to an upper surface 175 of the cavity 108. Undercut 134b is located vertically between undercut 134a and a straight interior side wall 177 of the rigid portion 112. The upper undercut 134a is delimited by an end section of layer structure 118 which protrudes laterally beyond an end section of stack 102 delimiting the lower undercut 134b.

Figure 9:
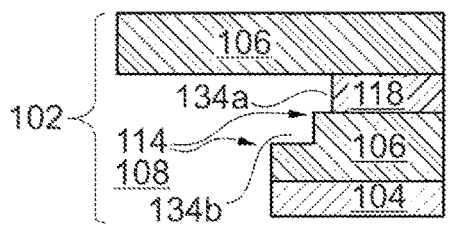

A difference between the double undercut 134a, 134b shown in FIG. 9 and the double undercut 134a, 134b shown in FIG. 8 is that, according to FIG. 9, the lower undercut 134b is delimited by an end section of stack 102 which protrudes laterally beyond an end section of layer structure 118 delimiting the upper undercut 134a.

Figure 10:
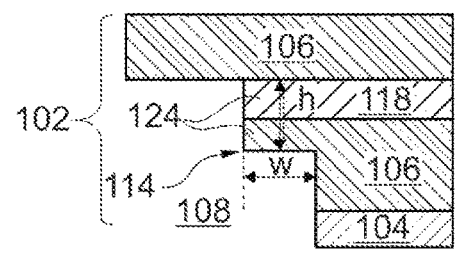

FIG. 10 illustrates a cross-sectional view of a stepped cavity portion of a component carrier 100 according to an exemplary embodiment of the invention. The embodiment of FIG. 10 shows a step 114 embodied as a protrusion. For example, a width "w" of the step 114 may be 30 µm in a horizontal direction. A height "h" of the step 114 may be for example 20 µm in a vertical direction.

Figure 11:
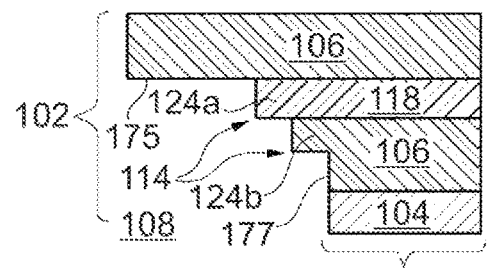

A difference between the cavity portion shown in FIG. 11 and the cavity portion shown in FIG. 10 is that, according to FIG. 11, a double protrusion 124a, 124b is formed corresponds to a double step 114, 114. Protrusion 124a is located directly adjacent to upper surface 175 of the cavity 108. Protrusion 124b is located vertically between protrusion 124a and straight interior side wall 177 of the rigid portion 112. The upper protrusion 124a is delimited by an end section of layer structure 118 which protrudes laterally beyond an end section of stack 102 delimiting the lower protrusion 124b.

The various embodiments shown in FIG. 7 to FIG. 11 can be manufactured by adjusting design parameters such as material of layer structure 118 (in particular no-flow or low-flow or ordinary prepreg to define the position and extension of layer structure 118), positioning of milling tool 116 (compare reference numerals 197, 199 in FIG. 3), dimension and relative position of indentation 130 (compare "d" and "I" in FIG. 2), etc.

Figure 12:
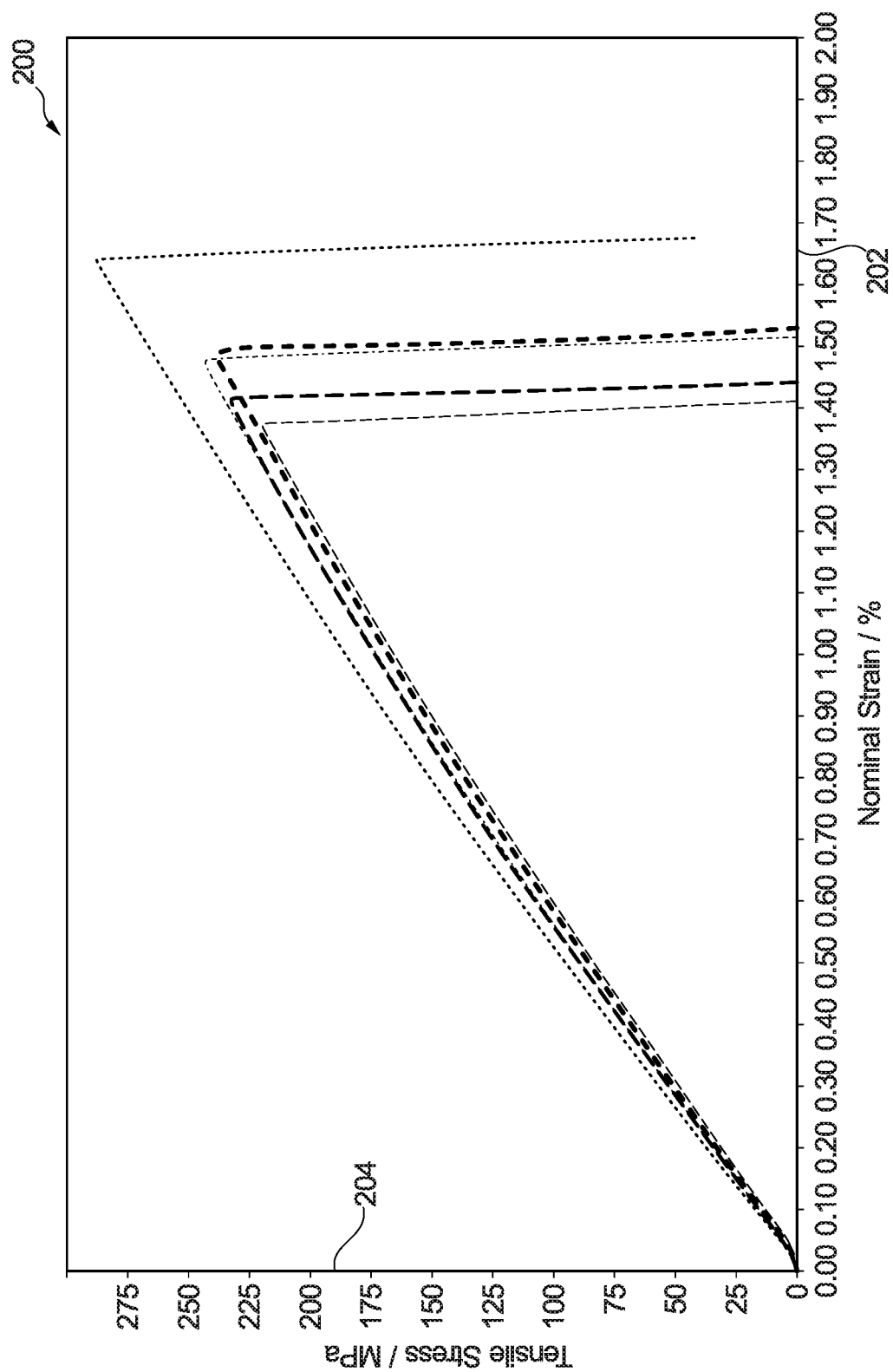
FIG. 12 illustrates the result of compressive stress experiments carried out with FR4 material.

FIG. 12 illustrates the result of compressive stress experiments on FR4 material (comprising resin and glass fibers). More specifically, diagram 200 of FIG. 12 has an abscissa 202 along which nominal strain applied to different FR4 samples is plotted in percent. Along an ordinate 204, the resulting tensile stress is plotted in MPa. The tensile strain is between 1.4% and 1.7%, whereas compressive strain is about 4%.

It should be noted that the term "comprising" does not exclude other elements or steps and the article "a" or "an" does not exclude a plurality. Also elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
a rigid portion;
a flexible portion;

a cavity defining the flexible portion next to the rigid portion; and at least one step in a transition portion between the rigid portion and the flexible portion in the cavity;

wherein the rigid portion comprises a first fully cured structure and a second fully cured structure with a layer structure of a re-meltable material sandwiched therebetween, wherein the first and second fully-cured structures are incapable of generating an adhering force for connecting adjacent layer structures by applying pressure and/or heat thereon, and the layer structure of the re-meltable material is capable to re-melt by applying heat and is capable to provide an adhesion function with connected layer structures upon triggering a curing process; and the step is formed by the layer structure of the re-meltable material and by the first second fully cured structure such that, in a cross-sectional view of the component carrier, the cavity comprises a first cavity portion having a first cavity width defined by at least a part of the second fully cured structure, and a second cavity portion having a second cavity width defined by at least a part of the layer structure of the re-meltable material, wherein the first width of the first cavity portion is constant in the entire first cavity portion and the second width of the second cavity portion increases starting out from a bottom of the cavity, wherein the first width is larger than the second width;

the rigid portion and the flexible portion share a common continuous electrically insulating layer structure which is part of the first fully cured layer structure and forms the bottom of the cavity.

2. The component carrier according to claim 1, wherein the rigid portion has a larger thickness than the flexible portion.

3. The component carrier according to claim 1, wherein the rigid portion and the flexible portion each comprise at least one electrically insulating layer structure and share a common electrically insulating layer structure.

4. The component carrier according to claim 3, wherein the at least one electrically insulating layer structure of the rigid portion and the at least one electrically insulating layer structure of the flexible portion are made of material having the same value of the Young modulus.

5. The component carrier according to claim 3, wherein the at least one electrically insulating layer structure of the rigid portion and the at least one electrically insulating layer structure of the flexible portion comprise resin with reinforcing glass particles.

6. The component carrier according to claim 1, wherein the flexible portion is one of the group consisting of a fully flexible portion, and a semi-flexible portion.

7. The component carrier according to claim 6, wherein the fully flexible portion comprises or consists of at least one of the group consisting of polyimide, polyamide, and liquid crystal polymer.

8. The component carrier according to claim 6, wherein the semi-flexible portion comprises or consists of at least one of the group consisting of FR4, and Resin Coated Copper.

9. The component carrier according to claim 1, wherein a width of the at least one step is at least 20 µm in a horizontal direction.

10. The component carrier according to claim 1, further comprising at least one of the following features:

wherein a height of the at least one step is at least 20 µm in a vertical direction;

wherein the at least one step is formed at least partially by a cured low-flow prepreg layer or a cured no-flow prepreg layer in the transition portion;

wherein the at least one step forms a convex protrusion extending from at least one corner of the cavity into the cavity;

wherein the at least one step forms an undercut in at least one corner of the cavity;

wherein the flexible portion is arranged between different sections of the rigid portion;

wherein the at least one step is configured as one of the group consisting of a single step, and a double step.

11. The component carrier according to claim 1, further comprising at least one of the following features:

at least one electrically conductive layer structure comprising at least one of the group consisting of copper, aluminum, nickel, silver, gold, palladium, and tungsten, any of the mentioned materials being optionally coated with supra-conductive material such as graphene;

at least one electrically insulating layer structure comprising at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;

at least one component mounted on or embedded in the component carrier, wherein the at least one component is selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip;

the component carrier is shaped as a plate;

the component carrier is configured as a printed circuit board, or a substrate.

12. The component carrier of claim 1, wherein the component carrier is an intermediate component carrier.

13. The component carrier of claim 1, wherein the at least one step is part of a convex protrusion that extends from a corner of the cavity into the cavity.

14. A method of manufacturing a component carrier, the method comprising:

forming a stack having a plurality of electrically conductive layer structures and a plurality of electrically insulating layer structures;

forming a cavity in the stack to thereby delimit a flexible portion from a rigid portion; and forming at least one step in the cavity in a transition portion between the rigid portion and the flexible portion;

wherein the step is formed by a layer structure of a re-meltable material and by a first second fully cured structure such that, in a cross-sectional view of the component carrier, the cavity comprises a first cavity portion part having a first cavity width defined by at least a part of the second fully cured structure, and a second cavity portion having a second cavity width defined by at least a part of the layer structure of the re-meltable material, wherein the first width of the first cavity portion is constant in the entire first cavity portion and the second width of the second cavity portion increases starting out from a bottom of the cavity, wherein the first width is larger than the second width;

wherein the rigid portion comprises a first fully cured structure and a second fully cured structured with a layer structure of the re-meltable material sandwiched therebetween, wherein the first and second fully-cured structures are incapable of generating an adhering force for connecting adjacent layer structures by applying pressure and/or heat thereon, and the layer structure of the re-meltable material is capable to re-melt by applying heat and is capable to provide an adhesion function with connected layer structures upon triggering a curing process;

the rigid portion and the flexible portion share a common continuous electrically insulating layer structure which is part of the first fully cured layer structure and forms the bottom of the cavity.

15. The method according to claim 14, further comprising:
forming the cavity by removing material of the stack by milling.

16. The method according to claim 14, further comprising:
defining the at least one step by correspondingly positioning a milling tool for removing material of the stack for forming the cavity.

17. The method according to claim 14, wherein forming the stack is accomplished by:
arranging an uncured layer structure between a first fully cured layer structure and a second fully cured layer structure; and
thereafter curing the uncured layer structure.

18. The method according to claim 17, wherein the second fully cured layer structure has a stepped profile with a central protrusion surrounded by a lateral base and an indentation between the central protrusion and the base.

19. The method according to claim 18, wherein the uncured layer structure is a patterned layer with a central recess extending to laterally surround the protrusion and the indentation and to accommodate the protrusion.

20. The method according to claim 18, further comprising:
forming the cavity by removing material substantially laterally inside of the indentation.

21. The method according to claim 20, wherein removing material substantially laterally inside of the indentation comprises cutting substantially around the indentation and taking out a piece of material defined laterally by a corresponding cutting line and horizontally by a direct interface between the first fully cured layer structure and the second fully cured layer structure.

22. A component carrier, comprising:
a rigid portion;
a flexible portion;
a cavity defining the flexible portion next to the rigid portion; and
at least one step in a transition portion between the rigid portion and the flexible portion in the cavity;
wherein the rigid portion comprises a first fully cured structure and a second fully cured structure with a layer of a re-meltable material sandwiched therebetween,
wherein the first and second fully cured structures are incapable of generating an adhering force for connecting adjacent layer structures by applying pressure and/or heat thereon, and the layer structure of the re-meltable material is capable to re-melt by applying heat and is capable to provide an adhesion function with connected layer structures upon triggering a curing process,
the flexible portion comprises the second fully cured structure but neither the first fully cured structure nor the layer structure of the re-meltable material;
the cavity is a hole with a closed bottom, the closed bottom being formed by the second fully cured structure; and
the step is formed by the layer structure of the re-meltable material and the second fully cured structure such that, in a cross-sectional view of the component carrier, the cavity comprises a first cavity portion having a first cavity width defined by at least a part of the second fully cured structure, and a second cavity portion having a second cavity width defined by at least a part of the layer structure of the re-meltable material,
wherein the first width of the first cavity portion is constant in the entire first cavity portion and the second width of the second cavity portion increases starting out from a bottom of the cavity, wherein the first width is larger than the second width;
the rigid portion and the flexible portion share a common continuous electrically insulating layer structure which is part of the first fully cured layer structure and forms the bottom of the cavity.

* * * * *

UNITED STATES PATENT AND TRADEMARK OFFICE
CERTIFICATE OF CORRECTION

| | | |
|---|---|---|
| PATENT NO. | : 11,324,126 B2 | Page 1 of 1 |
| APPLICATION NO. | : 16/947517 | |
| DATED | : May 3, 2022 | |
| INVENTOR(S) | : Bund | |

It is certified that error appears in the above-identified patent and that said Letters Patent is hereby corrected as shown below:

In the Claims

Claim 1, Column 17, Line 19, after "the" delete "first".

Signed and Sealed this
Twenty-first Day of June, 2022

Katherine Kelly Vidal
*Director of the United States Patent and Trademark Office*